(12) United States Patent
De Filippis (10) Patent No.: US 11,894,732 B2
(45) Date of Patent: Feb. 6, 2024

(54) ELECTRIC MACHINE

(71) Applicant: SPAL AUTOMOTIVE S.r.l., Correggio (IT)

(72) Inventor: Pietro De Filippis, Varazze (IT)

(73) Assignee: SPAL AUTOMOTIVE S.R.L., Correggio (IT)

( * ) Notice: Subject to any disclaimer, the term of this patent is extended or adjusted under 35 U.S.C. 154(b) by 203 days.

(21) Appl. No.: 17/241,193

(22) Filed: Apr. 27, 2021

(65) Prior Publication Data

US 2021/0344259 A1    Nov. 4, 2021

(30) Foreign Application Priority Data

Apr. 29, 2020    (IT) .................. 102020000009457

(51) Int. Cl.
*H02K 11/33*    (2016.01)
*H02K 9/22*    (2006.01)
(Continued)

(52) U.S. Cl.
CPC ............. *H02K 11/33* (2016.01); *H02K 9/227* (2021.01); *H05K 1/0206* (2013.01); *H05K 1/115* (2013.01); *H05K 1/181* (2013.01); *H02K 2211/03* (2013.01); *H05K 2201/066* (2013.01); *H05K 2201/1009* (2013.01); *H05K 2201/10166* (2013.01)

(58) Field of Classification Search
CPC .... H02K 11/0094; H02K 11/33; H02K 15/00; H02K 9/22; H02K 11/25; H02K 5/18; H02K 7/12
See application file for complete search history.

(56) References Cited

U.S. PATENT DOCUMENTS

| 7,462,965 | B2 * | 12/2008 | Natsuhara | H02K 5/15 |
| | | | | 310/68 D |
| 2014/0376190 | A1 * | 12/2014 | Dean | H01L 21/4882 |
| | | | | 361/720 |
| 2016/0006322 | A1 * | 1/2016 | De Filippis | H02K 11/33 |
| | | | | 310/64 |

FOREIGN PATENT DOCUMENTS

| DE | 10351826 A1 | 6/2005 |
| EP | 2957020 A1 | 12/2015 |

(Continued)

OTHER PUBLICATIONS

Italian Search Report dated Sep. 16, 2020 from counterpart Italian Patent Application No. 102020000009457.

*Primary Examiner* — Christopher M Koehler
*Assistant Examiner* — Leda T Pham
(74) *Attorney, Agent, or Firm* — SHUTTLEWORTH & INGERSOLL, PLC; Timothy J. Klíma (57) ABSTRACT

An electric machine includes a casing, a cap covering the casing to define an enclosure, a heat sink, a circuit board in the enclosure having a first conductive layer as a top face, a second conductive layer as a bottom face, and vias passing through the circuit board between the top and bottom faces. An electronic component is soldered to the circuit board on the first conductive layer and disposed on top of a first part of the vias. A conductive mass is soldered to the circuit board proximal to the electronic component and disposed on top of a second part of the vias. The conductive mass forms part of the circuit through which a power supply of the electric machine flows and is in electric and heat exchange relationship with the electronic component, while the bottom face is in heat exchange relationship with the heat sink.

15 Claims, 4 Drawing Sheets

(51) Int. Cl.
*H05K 1/02* (2006.01)
*H05K 1/11* (2006.01)
*H05K 1/18* (2006.01)

(56) References Cited

FOREIGN PATENT DOCUMENTS

| | | | | |
|---|---|---|---|---|
| EP | 3633720 A1 | * | 4/2020 | ........... H05K 1/0203 |
| EP | 3633720 A1 | | 4/2020 | |
| EP | 3641110 A1 | | 4/2020 | |

* cited by examiner

ELECTRIC MACHINE

This application claims priority to Italian Patent Application 102020000009457 filed Apr. 29, 2020, the entirety of which is incorporated by reference herein.

This invention relates to a rotary electric machine with reference in particular to an electronic module for driving the machine and preferably built into it.

In general, a rotary electric machine, for example a brushless electric motor to which reference is made hereinafter without limiting the scope of the invention, comprises a casing having inside a stator, rigidly connected to the casing, and a rotor, for example with permanent magnets, rotatably connected to the casing.

The casing is covered by a cap to form a container from which connecting pins protrude to allow powering and controlling the electronic drive circuitry.

An electronic module or electronic drive circuitry, connected to the stator and mounted inside the motor, comprises a printed circuit board and a plurality of active and passive electronic components mounted on what is known as the component side of the printed circuit board.

In use, some of the components generate large quantities of heat which must be dispersed so as not to have negative effects on the operation of the electronic module.

Moreover, during operation of the machine, these components have increasingly high current flowing through them.

Present-day market demands, in particular in the automotive sector, require electric machines which, under equal conditions of size, are much better performing in terms of efficiency and power output.

The market also demands electric motors that are less extensive but more powerful and capable of working in increasingly confined spaces and at increasingly high temperatures.

At the same time, manufacturers of electronic power components (MOS) are proposing components of this kind with increasingly compact packaging, with reduced heat exchange surfaces and with terminals or pins that are increasingly reduced in size and more densely spaced and where the size of the tab, both in plan and in thickness, is smaller and smaller, thus worsening not only its ability to transfer the heat generated inside it to the heat sink but also worsening heat dissipation on account of the Joule effect due to the passage of current.

Moreover, the increasingly reduced dimensional features of the tab, both in thickness and in surface area, as well as the minimal thickness of the first conductive layer of the printed circuit board where the MOS are normally positioned for technological low-cost applications, make it problematic to carry and draw the power current to and from the MOS.

The increasingly reduced geometric features also increase the electrical and thermal resistance of the connections, in particular relative to the previous-generation MOS.

Under these circumstances, the expected performance and product constraints have given rise to the need for different solutions, above all for disposing of the heat of the electronic components, in particular if used in control modules built into electric machines.

One of the main difficulties with electric machines of this kind, especially the hermetically closed ones known as "sealed" machines, is precisely how to dispose of the heat generated by the electronic module during the operation of the electric machine.

One solution intended to overcome this difficulty is described in document WO2014125412 in the name of the present Applicant.

Figure 7:
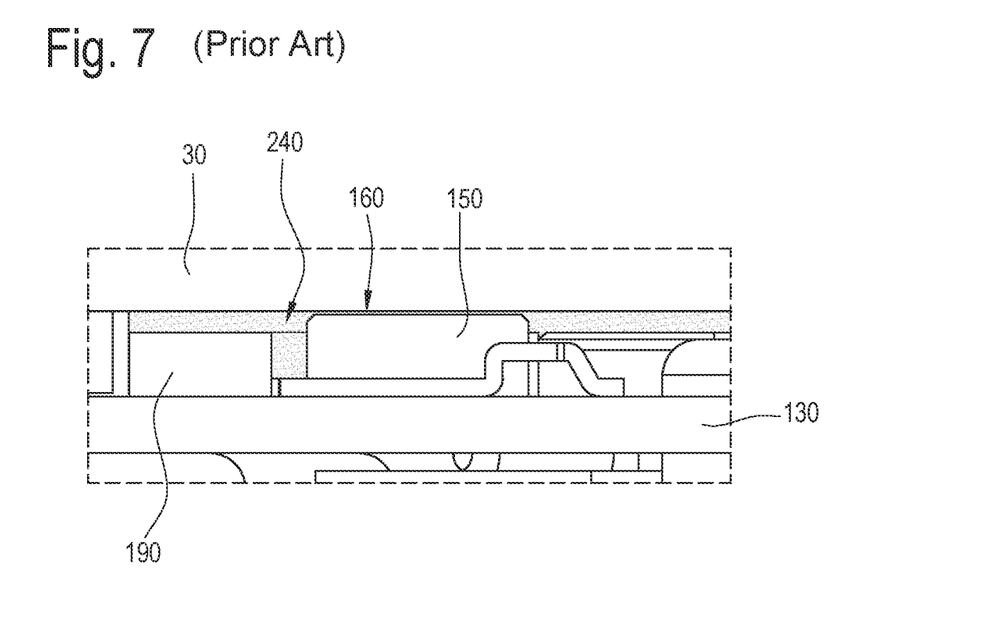
FIG. 7 (Prior Art) shows a schematic cross section of an example of a prior art electric machine.

The electric machine described in that document comprises, with reference to FIG. 7 relative to the prior art, an electronic module which in turn comprises a printed circuit 130, whose thermal conductivity is negligible, and a plurality of surface-mount electronic components, also referred to as "SMD electronic components", including, for example, power MOSFETs 150 each equipped with a respective case 160.

The machine is equipped with a heat sink for dissipating the heat generated by the electronic module and which the above-mentioned MOSFETs 150 face; the heat sink, in the example illustrated, preferably comprises the cap 30 of the electric machine.

In order to maximize the heat exchange between the MOSFETs 150 and the heat sink 30, the electronic module comprises, for each MOSFET 150, a heat transfer device 190 which is connected to the printed circuit at the respective MOSFET 150 to transfer the heat generated by the MOSFET 150 to the cap 30.

More specifically, it should be noted that, in the example illustrated, the transfer device 190 is soldered to the base or "tab" of the MOSFET 150 which is usually a tab that protrudes from the enclosure 160.

The heat generated by the MOSFET 150 during its operation therefore flows along the tab and from this to the heat transfer device 190 which, placed in contact with the cap 30, by a thermally conductive and electrically insulating paste 240, transfers the heat to the cap 30.

The solution described in WO2014125412 has structural constraints due in particular to new developments in the electronic components.

Owing to the increasingly reduced size of the tabs of new-generation MOSFETs, it is problematic, if not impossible, to solder the heat transfer device to the tabs.

Moreover, the height of the component to be cooled, measured along the axis of rotation of the electric machine, is necessarily the height of the heat transfer device, since that component also performs the function of spacer between the PCB and the heat sink.

The heat transfer device is, normally, the only thermal connection between component and heat sink, since the enclosure of the component is thermally and electrically insulating.

The thermally conductive paste is interposed between the surface of the heat sink, which is substantially flat, and the component side of the PCB, where the components and transfer devices differ in height, thus making it necessary to use relatively large, non-uniform quantities of paste.

In this context, our intention is to propose an electric machine capable of overcoming at least some of the drawbacks of the prior art and of meeting the above mentioned need.

More specifically, this invention has for an aim to provide an electric machine capable of effectively disposing of the heat generated by the electronic components operating inside it, despite the increasingly reduced size of the components, amongst other things.

Another aim of this invention is to propose an electric machine whose electronic module is able to manage high currents despite the smaller and smaller dimensions of the electronic components that populate the module.

This aim is achieved by an electric machine comprising the technical features described in one or more of the accompanying claims. The dependent claims correspond to possible different embodiments of the invention.

According to an aspect of it, this disclosure relates to an electric machine, preferably a brushless electric motor.

The electric machine in accordance with an aspect of the disclosure comprises an electronic module and a heat sink for dissipating the heat generated by the electronic module.

The heat sink may be, for example, the cap of the electric machine.

The electronic module comprises a printed circuit board, or PCB, made up of a plurality of layers and having a top face designed to receive the electronic components of the electronic module itself; this face is also called the "component side".

According to an aspect of the disclosure, the PCB has, on the component side of it, a thermally and electrically conductive layer, usually of copper.

The electronic module comprises at least one electronic component of a type which, in use, generates relatively high temperatures, such as, for example, a MOSFET or a shunt.

The electronic component has a base, disposed on the printed circuit board and connected to the first, thermally and electrically conductive layer.

Generally, the base or "tab" of the electronic component is part of the packaging for supporting the chip, in the case, for example, of a MOSFET, or in any case, an area of the component used for mounting the component, and has both a mechanical function and a thermal and electrical function.

According to an aspect of the disclosure, the base of the electronic component is soldered to the first layer of the printed circuit board.

According to an aspect of this disclosure, the electronic module comprises a thermally and preferably, electrically conductive mass—of copper, for example—disposed on the PCB as close as possible to the electronic component and in heat exchange relationship therewith.

According to an aspect, the conductive mass is also connected to the first layer of the printed circuit board and to the electronic component through the first layer of the printed circuit board.

According to an aspect, the conductive mass is connected to the electronic component through the base of the electronic component.

According to the disclosure, the direct soldering of the base of the electronic component to the conductive mass and/or the conductive layer of the PCB jointly or separately define a thermal and electrical connection between the electronic component and the conductive mass.

According to an aspect of the disclosure, the electronic component and the conductive mass are in heat exchange relationship, and preferably also in electrical exchange relationship, at least through the first PCB layer on which both are preferably soldered.

According to an aspect of the disclosure, the electronic component and the conductive mass are preferably soldered to each other, for example by a solder alloy, to facilitate heat exchange and/or the passage of electrical current.

According to an aspect of the disclosure, the PCB is provided, at least at the electronic component and at the respective conductive mass, with at least one metallized through hole, or what is known as a "via", which may have both electrical and thermal functions.

The PCB is provided with a plurality of vias, at least at the electronic component and at the conductive mass.

According to an aspect of the disclosure, the vias pass right through the thickness of the PCB, from the first face of it to the opposite face, on the side of the PCB opposite the electronic component and the conductive mass.

According to an aspect of the disclosure, the vias place the first conductive layer of the PCB in connection, both thermal and electrical, with the second face of the PCB.

In other embodiments, the vias place only some of the layers of the printed circuit board in thermal and electrical contact.

According to an aspect of the disclosure, the PCB has an electrically and thermally conductive layer which at least partly defines the face opposite to that where the components are mounted.

According to an aspect of the disclosure, the vias place at least the two outer layers of the printed circuit board in heat exchange relationship and both of the layers are thus affected by the heat produced by the electronic component.

According to an aspect, the face or side of the PCB opposite to that where the electronic component and the respective conductive mass are mounted are placed in heat exchange relationship by a heat sink.

The heat sink preferably has a flat surface parallel to the PCB; a thermally conductive and electrically insulating material is interposed between the PCB an the heat sink in order to maximize heat exchange between the two.

According to an aspect of the disclosure, the heat sink is defined by a cap which covers the motor and the electronic module is mounted in the motor with the electronic components and the respective thermally conductive masses facing towards the inside of the motor and the face of the PCB opposite to the electronic component side—that is, the bottom face of the PCB—facing towards the cap.

The heat generated, in use, by the electronic component—for example, a MOSFET—is at least partly transferred to the corresponding conductive mass.

The heat is transferred from the component to the conductive mass through the base of the component itself, which may be connected to the conductive mass directly, if the geometry of the base allows it, by soldering and/or through the first conductive layer of the PCB.

The direct soldering of the base $8a$ of the electronic component $8$ to the conductive mass $15$ and/or the conductive layer $12a$ of the PCB jointly or separately define a thermal and electrical connection between the electronic component $8$ and the conductive mass $15$.

From the base of the component and from the base of the conductive mass, the heat may flow along the corresponding vias towards the bottom face of the PCB and from there, through the thermally conductive paste, to the heat sink.

The bottom face of the PCB faces the heat sink and is substantially parallel to a face thereof and therefore the thickness of the thermally conductive paste is minimal and constant, thereby optimizing the heat exchange relationship between electronic module and heat sink.

The thermally conductive paste expands the area of the electronic component from which the heat may flow, through the vias, towards the bottom of the PCB and, from there, to the heat sink.

In practice, this eliminates heat concentrations on the PCB and improves the performance and reliability of the electronic module.

According to an aspect of the disclosure, the conductive mass is also electrically conductive and connected to a power track present in the electronic module.

In practice, the conductive mass acts simultaneously both as an electrical coupling between conductors of an electric power circuit that carry the "power" currents to the input and/or output—for example to a MOSFET—and as a thermal coupling.

According to an aspect, the conductive mass allows distributing the current towards the drain of the MOSFET, which coincides with its base, over most of the perimeter of the drain, minimizing the current density and the associated power dispersed in the conductive parts of the PCB, including, in particular, the first conductive layer and the vias.

According to an aspect of the disclosure, the conductive mass allows distributing the current affecting it also to all the conductive layers of the PCB which are electrically connected to each other and to the conductive mass through the vias under it.

Other features and advantages of the aforementioned aspects are more apparent in the indicative, hence non-limiting, description of a preferred but non-exclusive embodiment of an electric machine as shown in the accompanying drawings, which are provided for exemplary purposes only and in which.

Figure 1:
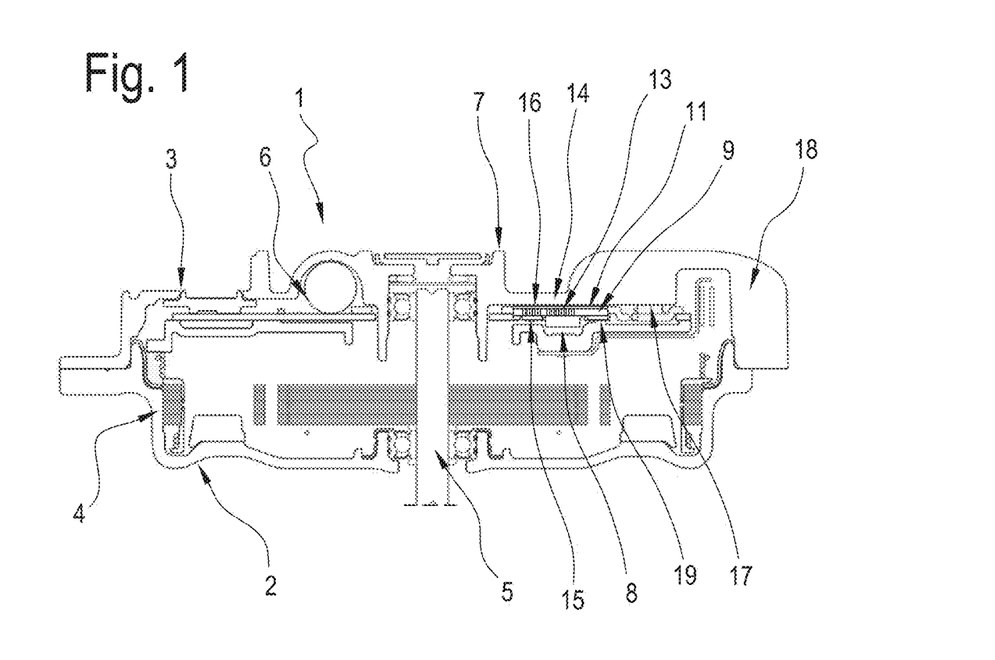
FIG. 1 is a schematic cross section, with some parts cut away for greater clarity, of an electric machine according to this disclosure.

With particular reference in particular to FIG. 1, the numeral 1 denotes an electric machine according to this disclosure.

The machine 1, in one embodiment, is an electric motor, for example of the sealed type, that is, without any openings for access to the inside, to which express reference will hereinafter be made but without thereby losing in generality, it being understood that unsealed or open motors or motors in which the electronic control circuitry is located in its own housing attached to, or even outside, the motor, or other electrical or electronic apparatuses are also included.

The electric machine 1 is hereinafter described in detail only insofar as necessary for understanding this disclosure.

The machine 1 comprises a casing 2 and a cap 3 to cover the casing 2 to form, with the casing 2, an enclosure or outer container.

The electric machine 1 comprises a stator 4 fixed to the casing 2 and a rotor 5, inserted in the enclosure, and rotatably attached to the enclosure.

The machine 1 has its own axis of rotation R around which the rotor 5 rotates.

The electric machine 1 comprises an electronic module 6 which, in the example illustrated, is at least partly inserted in the casing 2, for powering the stator 4 and controlling the motor 1.

The electric machine 1 also comprises a heat sink 7 for transferring the heat generated by the motor to an environment at a lower temperature.

In the context of this disclosure, the heat sink 7 disperses, in particular, the heat generated by the electronic module.

In the embodiment illustrated, the heat sink 7 is defined by the cap 3 covering the casing 2 and disperses the heat to the outside of the motor, in air, for example. In an alternative embodiment, the heat sink may disperse the heat to a water heat exchanger, for example.

The electronic module 6 comprises a plurality of electronic components, including, for example, electronic power components 8, meaning by that, generally speaking, components which, in use, generate large quantities of heat which must be dispersed so as not to have negative effects on the operation of the electronic module 6.

In an embodiment illustrated, the electronic component 8 whose heat has to be disposed of is, for example, a MOSFET, to which express reference is hereinafter made but without losing in generality. Another example of an electronic component which it is important to cool is a shunt, which is a component normally present in electronic control modules.

Generally, the component 8 has a base 8a which, in the case of the MOSFET, also constitute the drain of the MOSFET itself.

Figure 2:
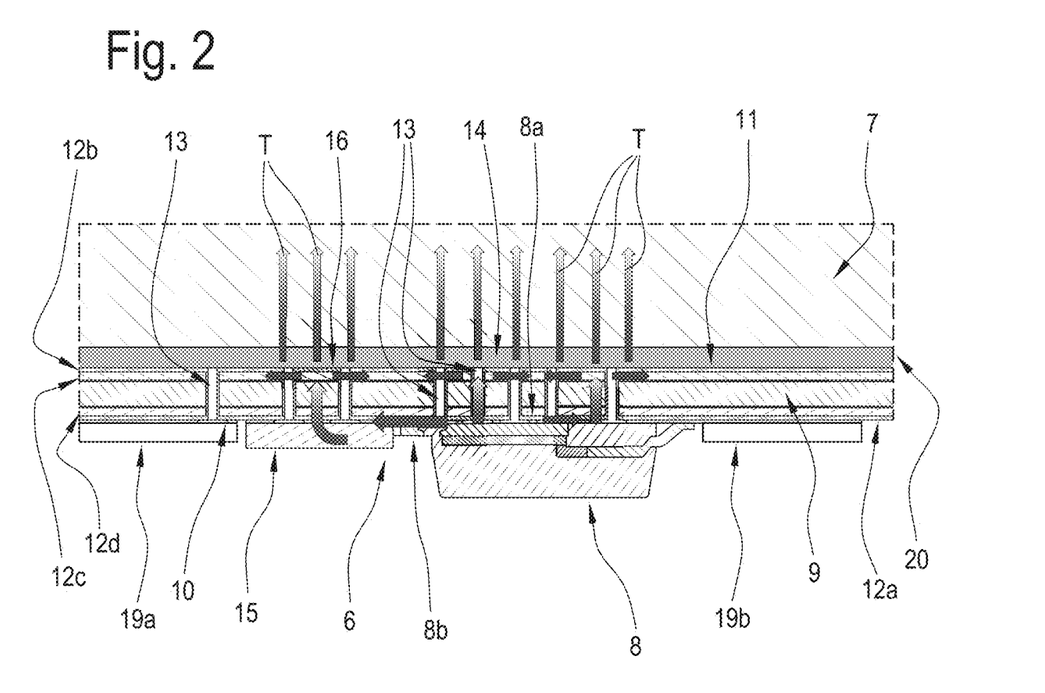
FIG. 2 is a schematic cross section of a detail of the electronic drive module of an electric machine in accordance with an aspect of this disclosure.

The electronic module 6 of the electric machine 1 comprises a printed circuit board 9, or PCB, which, in the embodiment illustrated by way of example, has four conductive layers 12a, 12b, 12c and 12d, of copper, for example.

The PCB is provided with what is known as a solder resist or solder mask, applied on the faces 10 and 11, for example, as protection for the copper and/or against short circuits between closely spaced uncovered parts.

In the embodiment illustrated by way of example, the electronic components 8 are mounted on the same face 10 of the printed circuit board 9; the face 10 is also called the component side of the printed circuit board 9 and, by convention, it is the top face of the PCB.

The component side 10 of the PCB is normally populated by numerous electronic power signal components which may be of SMD (surface mount device) or PTH (pin through hole) type; for the purposes of this disclosure, however, only electronic components 8 whose heat must be disposed of are illustrated.

The PCB has a second face 11, on the side opposite the top face or component side of the PCB, which is conventionally referred to as the bottom face of the PCB.

In the embodiment illustrated, the PCB comprises a conductive layer 12a on the face 10.

For PCBs relevant to this disclosure, the layer 12 generally has a thickness of 100 microns, for example.

Conventionally, the layer 12a is referred to as the first layer of the PCB and defines, in the embodiment illustrated, at least at the component 8, a conductive track or trace, in the face 10 of the PCB 9 on which the component 8 is mounted.

More specifically, the component 8 is soldered to the layer 12a and, in the case of the MOSFET, is soldered by its drain to the layer 12a.

In the context of this disclosure, the layer 12a, in practice, defines the top face 10 of the printed circuit board 9 on which the electronic component 8 is soldered by its base 8a.

In the preferred embodiment, the printed circuit board 9 comprises at least a second conductive layer 12b, of copper, for example, on the face 11. In the embodiment illustrated, the layer 12b defines, at least at the component 8, a conductive track or trace, on the face 11 of the PCB 9.

In the context of this disclosure, the layer 12b, in practice, defines the bottom face 11 of the printed circuit board 9 at least at the electronic component 8.

In effect, printed circuit boards normally have layers that are symmetrical, even in thickness, about their midplane to prevent deformation due to temperature changes.

The reference labels 12c and 12d indicate two further layers interposed between the layers 12a and 12b.

According to an aspect of this disclosure, the electronic module 6 comprises a system for transferring the heat T generated by the electronic component to a zone of the printed circuit board 9 from where it can be disposed of more easily.

According to this disclosure, the printed circuit board 9 has a plurality of through holes, or vias 13, of a type substantially known also as plated through hole.

Schematically defined, a via is a connection between the layers of a printed circuit board through the plane of one or more adjacent layers. Vias may perform both electrical and thermal functions in a substantially known manner.

A via may be made in the form of a metallized hole, internally empty and with a metal-plated wall, or full, for example, of copper.

More specifically, the vias 13 pass through the printed circuit board 9 between the top face 10, at least at the conductive layer 12a, and the bottom face 11, at least at the second conductive layer 12b.

According to an aspect of this disclosure, at least some of the vias 13 on the PCB are used, as will become clearer as this description continues, to transfer heat from the top face 10 to the bottom face 11 of the printed circuit board 9, and specifically, between the layers 12a and 12b with which the vias 13 are in thermal and electrical contact in substantially known manner.

A first part 14 of the vias 13 made on the PCB is located under the electronic component 8, meaning that the electronic component 8 is mounted over a first group 14 of vias.

The electronic module 6 comprises a conductive mass 15, also soldered to the printed circuit board in proximity to the electronic component 8.

The conductive mass 15, which preferably conducts both heat and electricity, is preferably disposed and soldered on the conductive layer 12a.

The conductive mass is preferably substantially coplanar with the respective electronic component.

The conductive mass 15 is preferably an element with a high thermal and electrical conductivity of the "SMD" type, that is, a "Surface Mount Device".

According to this disclosure, the conductive mass 15 is positioned on the printed circuit board, as close as possible to the corresponding electronic component 8, and is soldered to the conductive layer 12a.

That way, the heat T generated, in use, by the electronic component 8, can flow along the conductive layer 12a up to the conductive mass.

Figure 4:
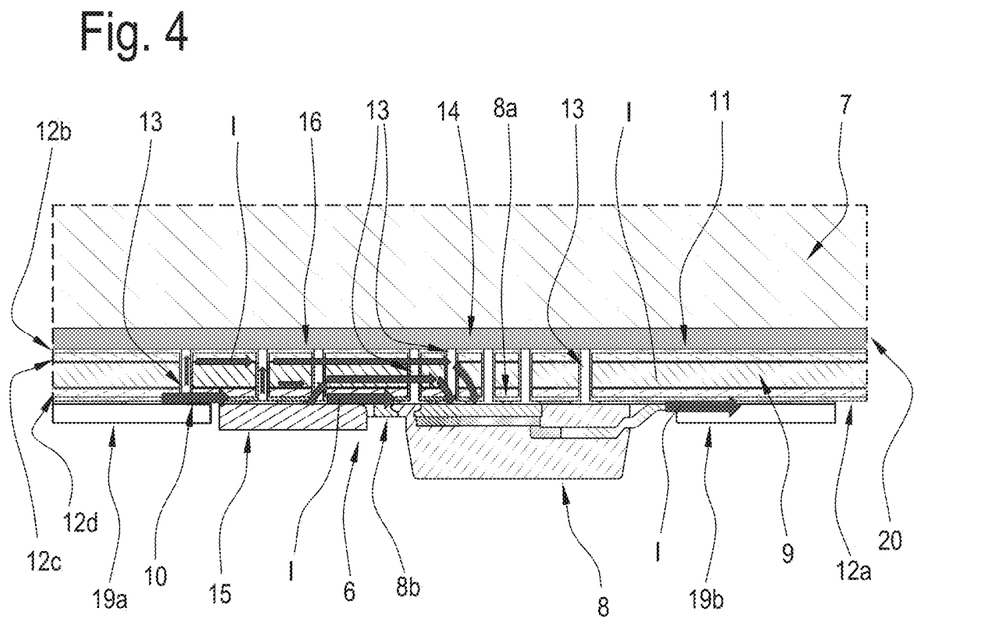
FIG. 4 is a schematic cross section of a detail of the electronic drive module of an electric machine in accordance with a second aspect of this disclosure.

In an embodiment, the conductive mass 15 may be soldered directly to the base 8a of the electronic component, in particular if the shape of the base allows it.

In the case of a MOSFET, where the base 8a has a tab 8b suitable for soldering, the conductive mass 15 is soldered directly to the tab 8b.

Generally speaking, according to this disclosure, the heat T generated by the electronic component flows to and spreads in the conductive mass 15.

The heat passes from the electronic component to the conductive mass through the base of the component, which may be soldered directly to the conductive mass and/or in heat exchange relationship therewith through the first conductive layer of the PCB.

The direct soldering of the base 8a of the electronic component 8 to the conductive mass 15 and/or the conductive layer 12a of the PCB jointly or separately define a thermal and electrical connection between the electronic component 8 and the conductive mass 15.

A second part 16 of the vias 13 of the PCB is located under the conductive mass 15, meaning that the conductive mass 15 is mounted over a second group 16 of vias 13.

In practice, the conductive mass 15 increases the heat exchange area of the electronic component 8 beyond the base 8a of the component and the two groups 14 and 16 of vias transfer the heat T to the bottom face 11 of the printed circuit board from where it can be dispersed, as schematically represented in particular in FIG. 2.

The second conductive layer 12b is preferably provided at least at the two groups of vias 14 and 16 of vias 13 which, in practice, transfer the heat at least from the layer 12a to the layer 12b.

Advantageously, the conductive mass 15 allows using a larger number of vias 13 compared to those that would normally be provided under the electronic component 8 alone, thus significantly increasing the amount of heat that can be carried to the other side of the printed circuit board 9 with respect to the component side 10.

In this sense, the mass 15 acts as a spreader which spreads the heat generated by the electronic component over an area significantly larger than the area of the electronic component alone.

Figure 3:
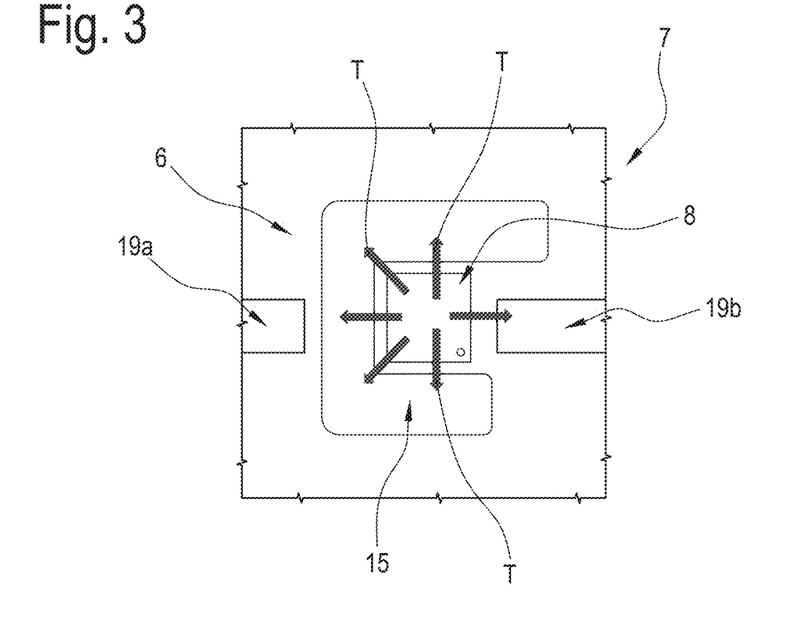
FIG. 3 is a schematic plan view of a detail of the electronic drive module of an electric machine in accordance with an aspect of this disclosure.

Considering an area in plan, occupied by the electronic component 8, this area is preferably occupied by vias 13, compatibly with the known constructional constraints of the printed circuit board 9.

Considering an area in plan, occupied by the conductive mass 15, this area is preferably occupied by vias 13, compatibly with the known constructional constraints of the printed circuit board 9.

The bottom face 11 of the printed circuit board 9 preferably faces towards the heat sink 7 and is in heat exchange relationship therewith so that the heat can be dispersed in an environment whose temperature is lower than that of the circuit.

Preferably, to better transfer heat to the heat sink 7, the layer 12b does not have the solder resist on at least part of the area at the electronic component 8 and/or at the conductive mass and at the respective vias.

In the preferred embodiment illustrated, the conductive layer 12b which, as mentioned, covers at least the zone of the groups 14 and 16 of vias, also acts as a spreader which spreads the heat T to the heat sink 7.

In an embodiment, all the PCB layers 12a, 12b, 12c, and 12d, which, as mentioned, cover at least the zone of the groups 14 and 16 of vias, also act as a spreader which spreads the heat T to the heat sink 7, since they are all connected by the vias 13.

In alternative embodiments not illustrated, in the absence of the conductive layer 12b, the heat is carried to the heat sink 7 by the ends of the vias 13 on the face 11.

In the preferred embodiment illustrated, at least one zone of the bottom face 11, or layer 12b, at the first and second groups 14, 16 of vias, is placed in heat exchange relationship with the heat sink 7.

In the example illustrated, the bottom face 11 of the printed circuit board 9, is placed in contact with the cap 3 of the motor, for example by interposing a thermally conductive and electrically insulating paste, generically denoted by the reference numeral 20, of substantially known type, such as, for example, what is known as a thermal interface material (TIM).

In a preferred embodiment, illustrated in FIG. 1, the heat sink 7 has a face 17 that is substantially parallel to the printed circuit board 9 so that the thermally conductive and electrically insulating paste has a constant thickness between the heat sink 7 and the printed circuit board 9, at least at the first and second groups 14, 16 of vias 13.

In the preferred embodiment illustrated, the paste 20 forms an uninterrupted layer of uniform thickness.

In the preferred embodiment illustrated, the heat sink 7, on the side opposite the face 17, has a plurality of fins 18, one of which is shown in FIG. 1, for dispersing in air the heat received from the cap 3.

In alternative embodiments not illustrated, instead of the fins 18, the heat sink 7 can disperse the heat in water or through ducting, for example.

Figure 5:
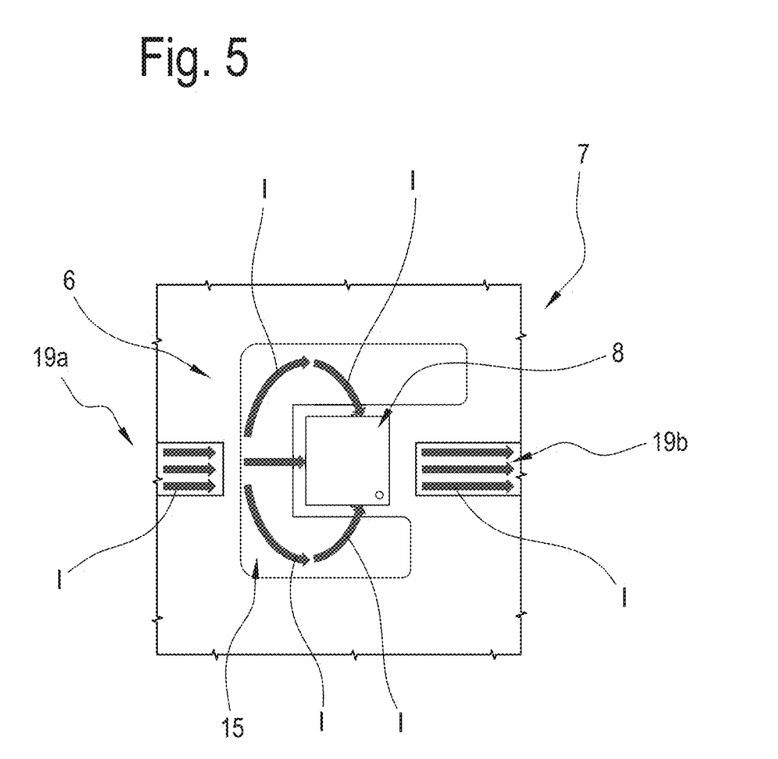
FIG. 5 is a schematic plan view of a detail of the electronic drive module of an electric machine in accordance with a second aspect of this disclosure.
Figure 6:
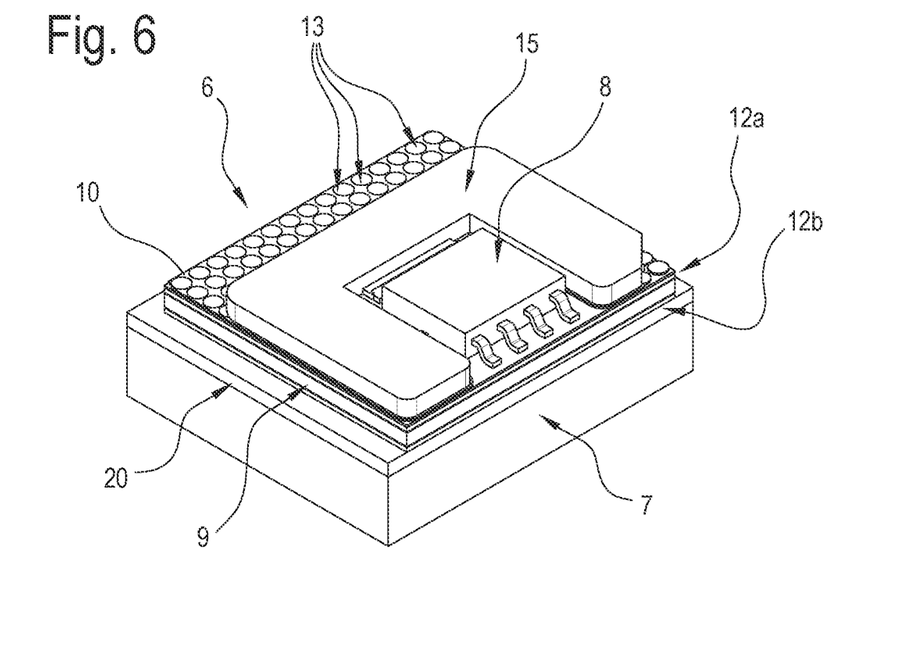
FIG. 6 illustrates a schematic perspective view of a detail of the electronic module for controlling an electric machine in accordance with an aspect of the invention.

In the preferred embodiment illustrated, the electronic module 6 comprises at least two conductive bars or tracks 19a, 19b for powering the electronic component 8.

The conductive tracks 19a, 19b are used for carrying to or away from the electronic component 8 the higher currents I which are necessary for the operation of the electronic module and which cannot circulate in the printed circuit board 9.

In known solutions, the conductive tracks are grouped, for example, in what is known as a lead frame. In a preferred embodiment, illustrated by way of example, the tracks 19a, 19b are part of a lead frame which makes the electrical power connections of the electronic module 6 and are not directly connected to each other.

Preferably, the conductive mass 15 is electrically connected to the tab of the MOS through the first conductive layer 12a in the example illustrated and/or directly through the solder, while the conductive layer 19b is electrically connected to the source of the electronic component 8.

In practice, the mass 15 is preferably part of the lead frame of the electronic module 6; hence, it is electrically connected to a further part 19a of the lead frame including further elements which are neither illustrated nor described in detail in that they are substantially known, which allow the power current I to pass.

The mass 15 may, for example, distribute the current I to the MOSFET drain in a path of minimum electrical resistance, minimizing current density and dissipated power.

In a preferred embodiment, shown for example in FIG. 5, the conductive mass 15 surrounds the MOSFET on three sides and allows distributing the current I towards the MOSFET drain along almost all of the perimeter of the electronic component.

In effect, the current I which flows through the conductive mass is preferably spread over all the PCB layers 12a, 12b, 12c and 12d, through the vias 13 of the group 16 under the mass itself and from these to the electronic component through the vias 13 of the group 14.

In use, the conductive mass collects the heat T generated by the corresponding electronic component: for example, the MOSFET or a shunt. As schematically represented by the arrows in FIGS. 2 and 3, part of the heat leaving the base of the component 8 passes through the PCB orthogonally along the vias located under the component and part of it spreads tangentially at least along the first layer of the PCB and/or directly to the conductive mass.

On the top face of the PCB, the heat T, thanks to the spreading effect of the conductive mass 15, is thus spread over a much larger area than that of the component that generated it.

In view of the size of the MOSFETs, for example, it is possible to increase up to 5 times the surface area of the component, considering also the conductive mass.

Thus, even the vias under the conductive mass carry the heat towards the bottom face of the PCB orthogonally to the PCB up to the layer 12b.

With reference in particular to FIGS. 4 and 5, it is observed that the MOSFET and conductive mass also exchange current I since they are connected to each other through the first layer of the PCB and/or through the solder between tab and conductive mass.

The conductive mass is joined to a conductive bar 19a of a high-current power line, in practice carrying the MOSFET connection to the power line very close to the MOSFET itself and over a larger perimeter determined by the surface of the conductive mass.

In practice, the conductive mass acts preferably both as a heat spreader and as a current spreader which facilitates the flow of current all the way along the boundary of the drain.

Advantageously, thanks to the vias, the current I may also flow through the further conductive layers of the PCB that are electrically connected to each other.

The price of the PCB is determined also by the number of layers it has and by their thickness; advantageously, the use of the conductive masses allows using less performing printed circuit boards, which are less expensive under equal conditions of power consumption and dissipation.

Compared to the Applicant's prior solution, the conductive mass may be dimensioned solely for thermal and electrical needs, without necessarily having to reach a height comparable to that of the corresponding electronic component, since it no longer needs to be close to the heat sink.

Moreover, the difficulty of soldering the conductive mass to the electronic component is also overcome, since the first layer of the PCB can be used for thermal and electrical connection.

Advantageously, compared to prior art solutions, the conductive mass also has less stringent constraints on the area it occupies on the PCB, since its function is no longer that of sole heat exchanger for exchanging heat with the heat sink because the electronic component, with its base, also exchanges heat directly with the heat sink through the PCB.

This reduction in its size has a positive side effect in that it makes more space available on the PCB for the other electronic components normally required, thus allowing the size and cost of the PCB to be reduced.

It is also possible to use one conductive mass for a plurality of electronic components: for example in the case where the electronic components are electrically connected to each other.

Owing to their size, new-generation electronic components must necessarily be mounted on the PCB and extending their heat exchange surface does not constitute a hindrance to mounting them.

The solution proposed allows powering a new-generation electronic component mounted on a PCB, even though it absorbs at least the same current as those of previous generations, for the same applications, but with very small current flow sections.

Indeed, such sections would involve unacceptable levels of current density in the PCB, which would lead to inadmissible overtemperatures.

The conductive masses are designed to distribute the current flow over the entire periphery of the PCB surrounding the MOS using the maximum possible flow section of the first layer of the PCB but also the inner layers of the PCB through the suitably disposed vias powered precisely by the preferably encircling structure of the additional conductive mass.

Advantageously, the conductive mass preferably fulfils both a thermal and an electrical function thanks to its electrically conductive structure with very low electrical resistance, especially if compared to the structure of the first PCB layer (100 microns), which maximizes the current flow section in the short stretch in which the current must flow through the thin first layer of the PCB.

The invention claimed is:

1. An electric machine comprising:
   an enclosure including:
      a casing; and
      a cap configured to cover an opening in the casing;
   a heat sink, wherein the heat sink includes at least a portion of the cap;
   an electronic module positioned within the enclosure and comprising:
      a printed circuit board including a first conductive layer defining, at least partly, a first face of the printed circuit board, a second face of the printed circuit board, a plurality of vias which pass through the printed circuit board between the first face, in contact with the first conductive layer, and the second face,
      an electronic component having a base soldered to the printed circuit board on the first conductive layer and disposed, at least partly, covering at least a first part of the vias,
      a conductive mass, soldered to the printed circuit board on the first conductive layer in proximity to the electronic component and disposed, at least partly, covering at least a second part of the vias, the conductive mass and the electronic component being in heat exchange relationship through a thermal and electrical connection,
      the second face of the printed circuit board facing outwardly of the electric machine toward the heat sink and being in heat exchange relationship with the heat sink, the electronic component and the conductive mass facing inwardly of the electric machine and being in heat exchange relationship with the heat sink through the first conductive layer and at least the first part and the second part of the vias.

2. The electric machine according to claim 1, wherein the conductive mass is soldered to the first conductive layer, and wherein the thermal and electrical connection comprises the first conductive layer.

3. The electric machine according to claim 1, wherein the base comprises a tab suitable for soldering and the conductive mass is soldered to the tab, and wherein the thermal and electrical connection comprises the tab.

4. The electric machine according to claim 1, wherein the electronic module comprises a conductive track disposed on the printed circuit board for powering the electronic component, the conductive mass being electrically connected to the conductive track and the electronic component being electrically connected to the conductive track through the conductive mass, the conductive mass being electrically connected to the electronic component through the thermal and electrical connection.

5. The electric machine according to claim 1, wherein the first part of the vias occupies at least an entire area occupied by the electronic component.

6. The electric machine according to claim 1, wherein the second part of the vias occupies at least an entire area occupied by the conductive mass.

7. The electric machine according to claim 1, wherein the conductive mass at least partly surrounds the electronic component.

8. The electric machine according to claim 1, wherein the electronic component is a MOSFET and the base of the electronic component is a drain of the MOSFET.

9. The electric machine according to claim 1, wherein the heat sink is defined by the cap.

10. The electric machine according to claim 1, and further comprising a thermal interface material that is thermally conductive and electrically insulating, interposed between the second face of the printed circuit board and the heat sink at least at the first part and the second part of the vias.

11. The electric machine according to claim 10, wherein the heat sink includes a face that is parallel with the printed circuit board and the thermal interface material has a constant thickness between the heat sink and the printed circuit board.

12. The machine according to claim 10, wherein the printed circuit board has a second conductive layer which at least partly defines the second face of the printed circuit board, the second conductive layer being in heat exchange relationship with the electronic component and the conductive mass through at least the first part and the second part of the vias and being in heat exchange relationship with the heat sink through the thermal interface material, the vias being in contact with the second conductive layer.

13. The electric machine according to claim 12, wherein the printed circuit board omits a solder mask on the second conductive layer at least at one of the first part or the second part of the vias.

14. The electric machine according to claim 1, wherein the printed circuit board comprises a plurality of conductive layers at least partly interconnected by the vias.

15. The electric machine according to claim 1, wherein the vias are at least one chosen from open and fully metallized holes.

* * * * *